(12) United States Patent
Wiener

(10) Patent No.: US 8,392,003 B2
(45) Date of Patent: Mar. 5, 2013

(54) PRE-FILTER FOR A SERVO CONTROL LOOP, AND APPLICATIONS THEREOF

(75) Inventor: Roberto B. Wiener, Ridgefield, CT (US)

(73) Assignee: ASML Holding N.V., Veldhoven (NL)

( * ) Notice: Subject to any disclaimer, the term of this patent is extended or adjusted under 35 U.S.C. 154(b) by 1121 days.

(21) Appl. No.: 12/329,908

(22) Filed: Dec. 8, 2008

(65) Prior Publication Data

US 2009/0154311 A1 Jun. 18, 2009

Related U.S. Application Data

(60) Provisional application No. 61/014,354, filed on Dec. 17, 2007.

(51) Int. Cl.
*G05B 11/01* (2006.01)
*G05B 13/02* (2006.01)

(52) U.S. Cl. ............... 700/78; 700/42; 700/44; 700/54

(58) Field of Classification Search .............. 700/78, 700/37, 42, 44, 45, 54, 60, 121, 55
See application file for complete search history.

(56) References Cited

U.S. PATENT DOCUMENTS

| 2005/0043834 A1* | 2/2005 | Rotariu et al. ............... 700/95 |
| 2006/0170382 A1* | 8/2006 | Yang et al. ................... 318/114 |
| 2006/0285101 A1* | 12/2006 | Butler et al. ................. 355/75 |

FOREIGN PATENT DOCUMENTS

| JP | 61-196302 A | 8/1986 |
| JP | 07-152406 A | 6/1995 |
| JP | 10-125594 A | 5/1998 |
| JP | 2005-025316 A | 1/2005 |

OTHER PUBLICATIONS

English language Abstract of Japanese Patent Publication No. 2005-025316 A, published Jan. 27, 2005, the Japanese Patent Office; 1 page.
English language translation of Japanese Notification of Reasons for Refusal directed to related Japanese Patent Application No. 2008-320222, the Japanese Patent Office, mailed Jun. 7, 2011; 3 pages.
Damera-Venkata et al., "Design of Optimal Minimum-Phase Digital FIR Filters Using Discrete Hilbert Transforms", IEEE Transactions on Signal Processing, vol. 48, Issue 5, May 2000, pp. 1491-1495.
Proakis et al., *Digital Signal Processing: Principles, Algorithms, and Applications*, "Design of FIR Filters", Prentice Hall, Third Edition, 1996, Section 8.2, pp. 620-652.
Lertniphonphun et al., "Unified Design Algorithm for Complex FIR and IIR Filters", IEEE International Conference on Acoustics, Speech, and Signal Processing, vol. 6, May 7, 2001, pp. 3801-3804.

(Continued)

*Primary Examiner* — Charles Kasenge
*Assistant Examiner* — Steven Garland
(74) *Attorney, Agent, or Firm* — Sterne, Kessler, Goldstein & Fox P.L.L.C

(57) ABSTRACT

A method, system and computer program product to control position of an error control module in a lithography apparatus using a servo control loop is described herein. The system comprises a filter, a servo controller coupled to the filter and configured to receive a control signal and an actuator coupled to the servo controller and configured to control the position of the error control module. The filter is configured to filter the control signal by modulating the amplitude and phase of the control signal in a desired frequency range, prior to the servo control loop.

18 Claims, 7 Drawing Sheets

OTHER PUBLICATIONS

English-Language Abstract for Japanese Patent Publication No. 61-196302 A, published Aug. 30, 1986; 1 page.

English-Language Abstract for Japanese Patent Publication No. 07-152406 A, published Jun. 16, 1995; 1 page.

English-Language Abstract for Japanese Patent Publication No. 10-125594 A, published May 15, 1998; 1 page.

English-Language Translation of Notification of Reason(s) for Refusal directed to related Japanese Patent Application No. 2008-320222, mailed Jan. 31, 2012, from the Japanese Patent Office; 2 pages.

* cited by examiner

PRE-FILTER FOR A SERVO CONTROL LOOP, AND APPLICATIONS THEREOF

CROSS REFERENCE TO RELATED APPLICATION(S)

This application claims benefit under 35 U.S.C. §119(e) to U.S. Provisional Patent Application No. 61/014,354, file Dec. 17, 2007, which is incorporated by reference herein in its entirety.

BACKGROUND

1. Field of the Invention

The present invention relates to a pre-filter for a servo control loop, and applications thereof.

2. Related Art

A lithographic apparatus is a machine that applies a desired pattern onto a target portion of a substrate. The lithographic apparatus can be used, for example, in the manufacture of integrated circuits (ICs), flat panel displays, and other devices involving fine structures. In a conventional lithographic apparatus, a patterning means, which is alternatively referred to as a mask or a reticle, may be used to generate a circuit pattern corresponding to an individual layer of the IC (or other device), and this pattern can be imaged onto a target portion (e.g., including part of, one or several dies) on a substrate (e.g., a silicon wafer or glass plate) that has a layer of radiation-sensitive material (e.g., resist).

During the lithography process, actuators are used to position various modules of the lithography apparatus. Often there is an error in the positioning, velocity or acceleration of modules. Errors in the position, velocity or acceleration of a module degrade the desired tool performance. If possible, the negative effect of these errors in performance is compensated by generating an error signal to control the position of one or more additional modules that correct the error or by actively modifying the position of existing modules. However, the error control signal frequently used for this purpose is itself prone to errors and may be reliable only for a certain frequency range

SUMMARY

Embodiments of the invention comprise a method, system and computer program product to control position of an error control module in a lithography apparatus using a servo control loop. The servo control loop comprises a filter, a servo controller, and an actuator. The filter is configured to filter a first control signal received from a first module by modulating an amplitude and phase of the first control signal, in a desired frequency range. The servo controller is configured to receive the filtered first control signal and a third control signal and to provide a second control signal therefrom. The actuator is coupled between the servo controller and the error control module and is configured to receive the second control signal and to provide the third control signal therefrom. The third signal is received at the error control module and configured to control the error control module.

In an embodiment, a servo control loop further comprises one or more of an amplifier, a first feed forward circuit, a second feed forward circuit and a second filter.

In an embodiment, a filter is a low pass finite impulse response filter with substantially zero phase delay and the control signal is a reference error control signal to control an error control mirror and redirect a beam of radiation to a wafer table.

BRIEF DESCRIPTION OF THE DRAWINGS/FIGURES

The accompanying drawings, which are incorporated herein and form a part of the specification, illustrate embodiments of the present invention and, together with the description, further serve to explain the principles of the invention and to enable a person skilled in the pertinent art to make and use the invention.

The present invention will now be described with reference to the accompanying drawings. In the drawings, like reference numbers may indicate identical or functionally similar elements.

DETAILED DESCRIPTION

Table of Contents

1. Example Servo System
2. Example Embodiment
3. Example Lithography Apparatus
4. Example computer system
5. Exemplary Operation
6. Conclusion

1. Example Servo System

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described can include a particular feature, structure, or characteristic, but every embodiment cannot necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the invention can be implemented in hardware, firmware, software, or any combination thereof. Embodiments of the invention can also be implemented as instructions stored on a machine-readable medium, which can be read and executed by one or more processors. A machine-readable medium can include any mechanism for storing or transmitting information in a form readable by a machine (e.g., a computing device). For example, a machine-readable medium can include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions can be described herein as performing certain actions. However, it should be appreciated that such descriptions are merely for convenience and that such actions in fact result from computing devices, processors, controllers, or other devices executing the firmware, software, routines, instructions, etc.

Figure 1A:
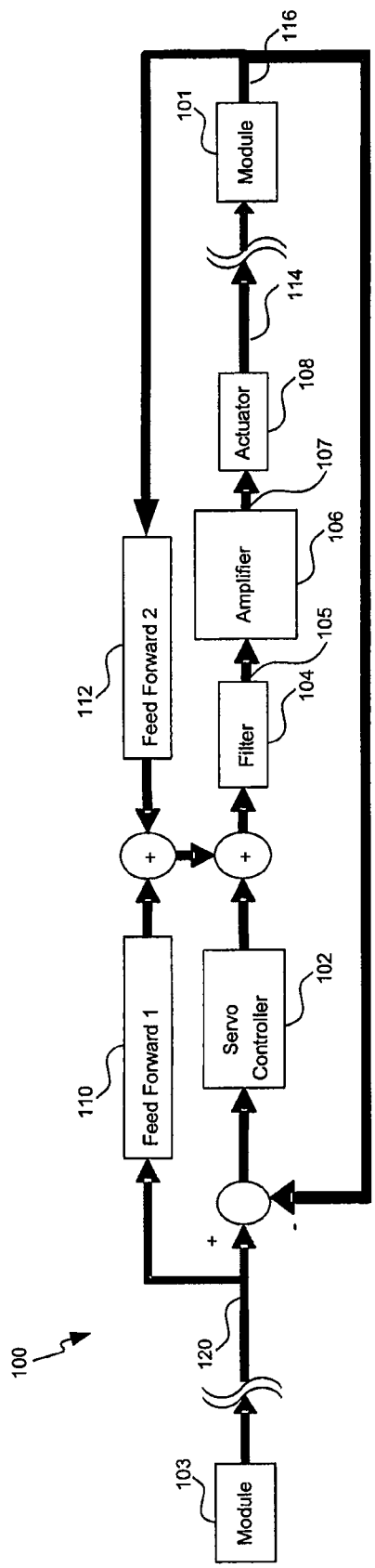
FIG. 1A depicts a control system to control position of a module.
Figure 5:
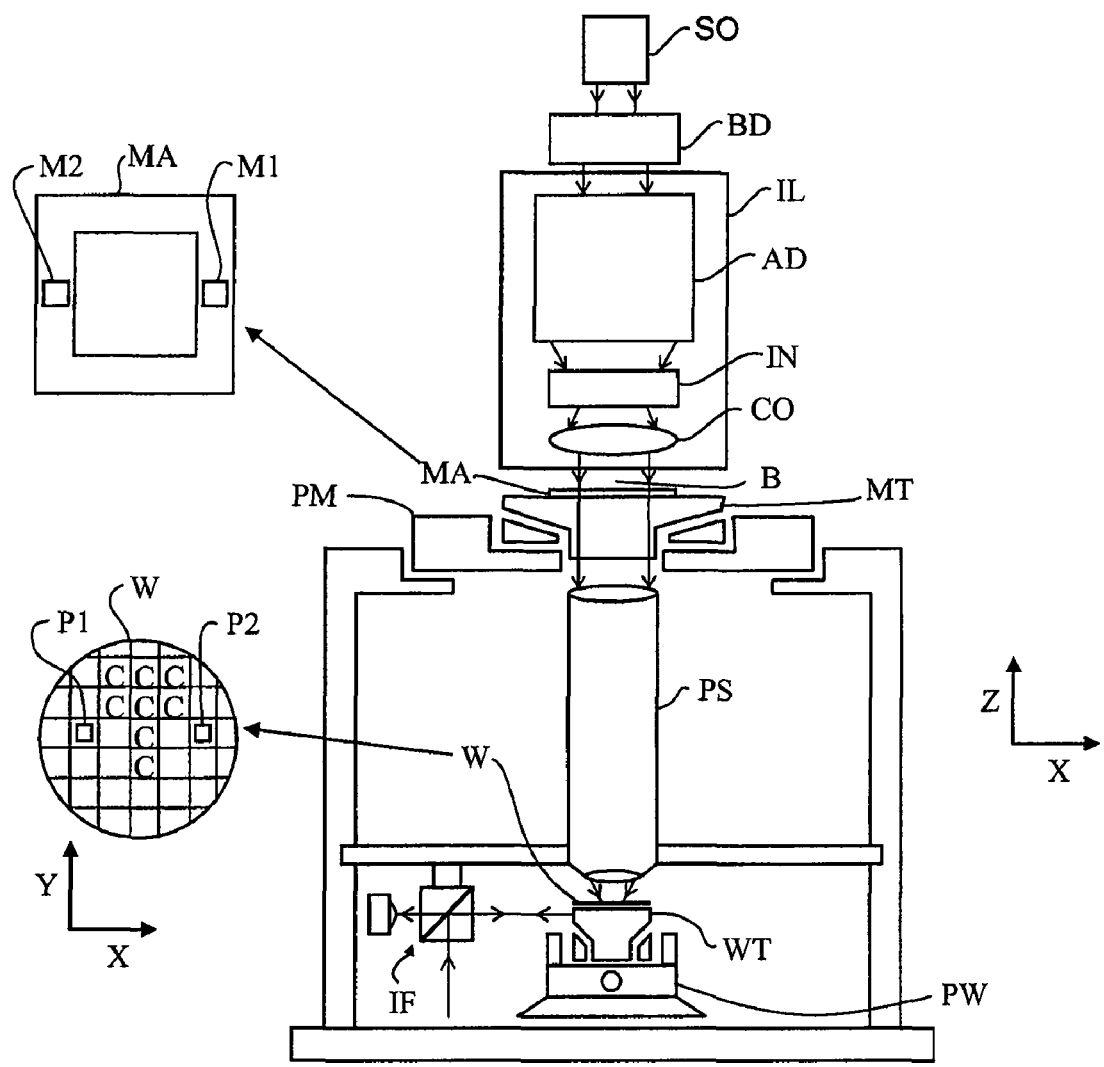
FIG. 5 depicts an exemplary lithography system, which may include a control system.

FIG. 1A depicts a control system 100 to control position of a module 101. System 100 includes a servo controller 102, a filter 104, an amplifier 106, an actuator 108, a first feed forward circuit 110, and a second feed forward circuit 112. Control system 100 processes a reference error signal 120, which may be received from module 103. In an embodiment, control system 100 may be used to control the position of an error control mirror for a wafer or substrate stage in a lithographic apparatus, for example a lithography apparatus as illustrated in FIG. 5 and described below.

Servo controller 102 is coupled to filter 104. Amplifier 106 is coupled between filter 104 and actuator 108. First feed forward circuit 110 receives reference signal 120. Signal 114 is generated by actuator 108 to control module 101. Signal 116 generated by module 101 is fed to second feed forward circuit 112 and to servo controller 102. The outputs of first feed forward circuit 110, second feed forward circuit 112 and servo controller 102 are summed and fed to filter 104. Filter 104 generates signal 105 that is fed to actuator 108.

First feed forward circuit 110, second feed forward circuit 112, servo controller 102, filter 104, amplifier 106 and actuator 108 form a "servo control loop". In alternate embodiments, first feed forward circuit 110, second feed forward circuit 112 and filter 104 may be optional components of the servo control loop. This is similar in the embodiment discussed below.

Reference error signal 120 is representative of any error in, for example, position, velocity or acceleration of module 103. In an embodiment, module 103 includes a plurality of modules. For example, reference error signal 120 can represent a measure of the error in change in position, velocity or acceleration of module 103. In a lithography apparatus, for example as illustrated in FIG. 5, module 102 may be wafer stage WT. Module 101 which can be controlled by signal 114 generated by actuator 108 is used to correct the error in position, velocity or acceleration of module 103.

Signal 116 and reference error signal 120 are fed to servo controller 102, which generates a control signal 107 to control actuator 108. Servo controller 102 is configured to control actuator 108. Actuator 108 controls position of module 101 using signal 114. Actuator 108, for example, changes position of a mirror in module 101 that is used to re-direct light to a wafer stage in a lithography apparatus or changes the acceleration or velocity of module 103. In alternate embodiments, actuator 108 may change pressure of a gas or control temperature associated with the lithography system or module 103.

Filter 104 may be, for example, a low pass filter, a high pass filter, a band pass filter, a notch filter or a band stop filter. In some systems, filter 104 is optional.

Amplifier 106 is used to amplify the signal 105 generated by filter 104.

In one example, reference error signal 120 is reliable for only certain frequency ranges due to errors induced by vibration, temperature, or pressure changes. Typically, position measurement of module 103, such as a wafer stage system of a lithographic apparatus, is determined or calculated relative to the position of a measurement reference (not shown). It may be assumed that the measurement reference is inertial or its position can be easily related to a reference frame. However, a measurement reference is not fixed and moves due to material deformation, vibration, changes in temperature and pressure. In addition, many sensors used to measure position errors and generate reference error signal 120 are themselves sensitive to environmental factors including but not limited to variations in pressure, temperature and humidity.

For example, if position of a wafer stage module is being measured with respect to a reference projection lens, then the wafer stage position measurement is subject to material deformation, vibration, structural flexible modes and similar factors that adversely impact measurement accuracy of reference error signal 120. Reference error signal 120 that is itself inaccurate as shown in system 100 is not useful to correct the position of a module 103 using module 101 controlled by signal 114.

Figure 1B:
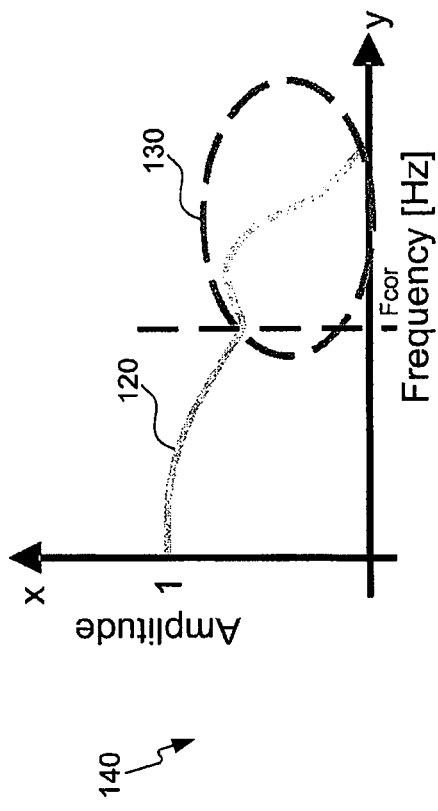
FIG. 1B depicts a graph that illustrates an unfiltered control signal for the system illustrated in FIG. 1A.

FIG. 1B depicts a graph 140 that illustrates an un-filtered reference error signal 120. In this example, reference error signal 120 is reliable from 0 Hz to a certain frequency Fcor. Frequency Fcor varies according to the device used to measure error and may be calculated or determined based on experimentation. The frequency range of reference error signal 120 subsequent to Fcor is not reliable as is seen by excitation response 130.

To use the reliable portion of reference error signal 120 until frequency Fcor, some systems filter reference error signal 120 up to a frequency below the minimum bending mode of a measurement reference, moving module 103 and other sources of noise measurement. Typically, filtering is performed using Finite Impulse Response (FIR) filters. However, some design techniques yield filters with a linear phase delay over a desired pass band frequency range resulting in a constant group delay for a group of filters. These filters introduce a phase delay in the reference error signal 120, which affects the accuracy of reference error signal 120 and is detrimental to the adjustment of module 101 by actuator 108. Any phase contribution to error reference signal 120 introduces a tracking error that is not correctable by the servo control loop. Thus, a filter with zero phase delay in the pass band for error reference signal 120 is desired. Embodiments presented herein describe the use of a filtering scheme to modulate amplitude and phase characteristics of reference signal 120 in the desired pass band frequency range. In an embodiment, the filtering scheme described herein is used in conjunction with the known magnitude and phase characteristics of the servo control loop in order to achieve the desired system magnitude and phase response for reference signal 120.

2. Example Embodiment

Figure 2:
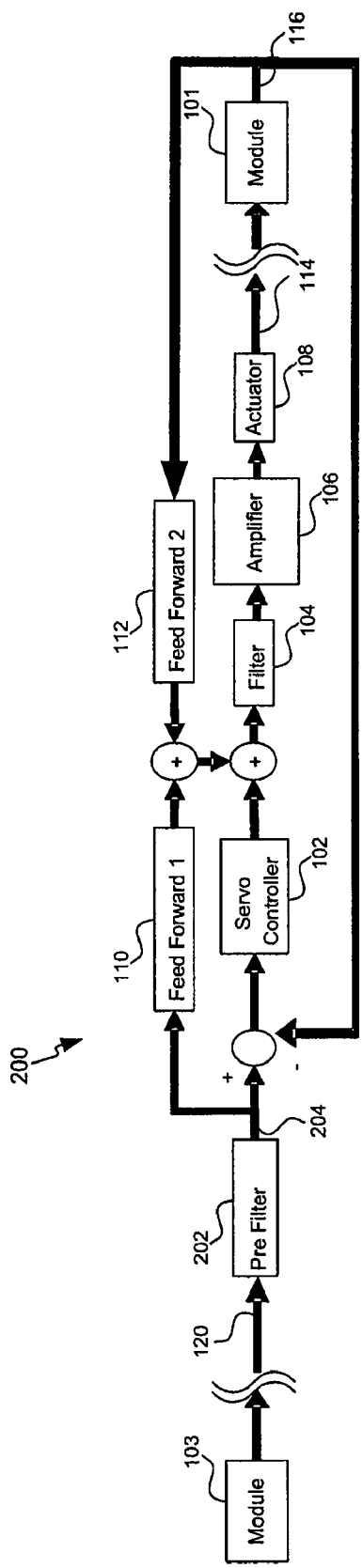
FIG. 2 depicts an exemplary control system to control position of a module.

FIG. 2 depicts an exemplary control system 200 to control position of a module 101. System 200 includes pre-filter 202, servo controller 102, filter 104, amplifier 106, actuator 108, first feed forward circuit 110, and second feed forward circuit 112. System 200 receives reference error signal 120 from module 103 and produces signal 114 therefrom, that is transmitted to module 101. Other than as described below, control system 200 can function similarly to control system 100 described above, and contain similar optional elements as described above.

First feed forward circuit 110, second feed forward circuit 112, servo controller 102, filter 104, amplifier 106, actuator 108, and per-filter 202 can be said to form a "servo control loop".

According to one embodiment of the invention, reference signal 120 is filtered by pre-filter 202 prior to being received by the servo control loop, described in more detail below. Pre-filter 202 is used to filter reference error signal 120 by modulating an amplitude and phase of reference error signal 120 in a desired frequency range, prior to reference error signal 120 being received by the servo control loop as filtered reference error signal 204. In an embodiment, pre-filter 202 has zero attenuation in a desired pass band of error reference signal 120 and maximum attenuation in the frequency range. In an embodiment, pre-filter 202 has nonlinear phase characteristics and is a finite impulse response (FIR) filter. For example, with reference to FIG. 1B, pre-filter 202 will allow the reference error signal 120 to pass through un-attenuated with substantially zero phase delay up to frequency Fcor and after frequency Fcor attenuate signal 120 (e.g., attenuate up to 10 dB) thereby substantially eliminating the impact of the error induced by excitation response region 130 of reference error signal 120. In an embodiment, the pass band region of the pre-filter 202 has non-linear phase characteristics (such as substantially zero phase delay). The stop band region of pre-filter 202 may or may not have non-linear phase characteristics.

In an embodiment, the desired pass band frequency range of reference error signal 120 may be a low pass frequency range of about 0-600 Hz, a high pass frequency range of about above 10 Hz and greater, a band pass frequency range of about 10 Hz-600 Hz or a band stop frequency range of about 5 Khz-6 Khz. It is to be appreciated that the pass band frequency range and non-linear phase characteristics are application specific.

Figure 3:
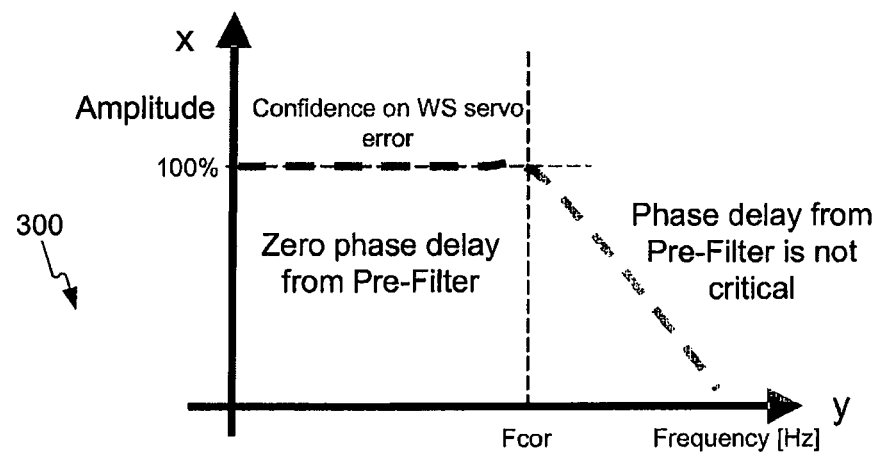
FIG. 3 depicts graphs illustrating use of a pre-filter to filter a control signal.
Figure 3:
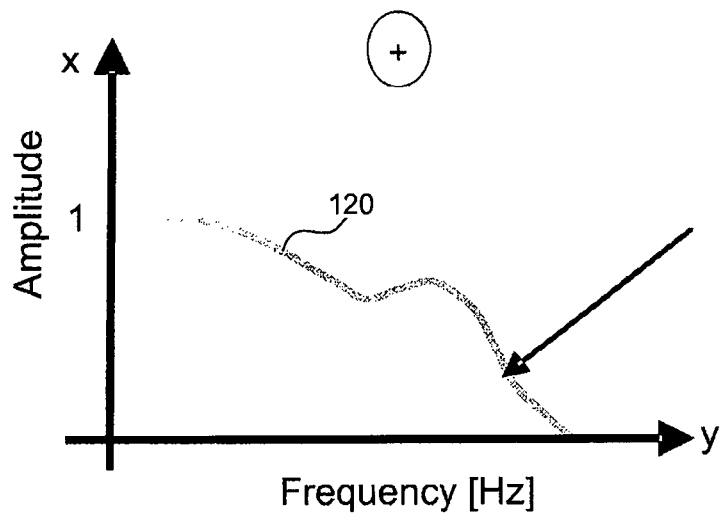
Figure 3:
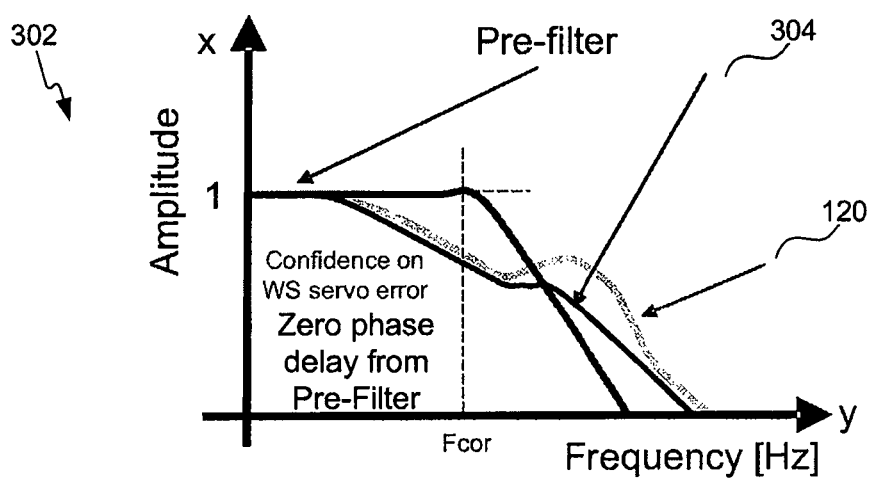

FIG. 3 depicts graphs illustrating example frequency responses of pre-filter 202, unfiltered reference error signal 120 and filtered reference error signal 204. Graph 300 illustrates an example frequency response of pre-filter 202. Graph 140 depicts un-filtered error control signal 120. In one example, pre-filter 202 when applied to reference error signal 120 shown in graph 140 results in filtered reference error signal 204 illustrated in graph 302.

Graph 300 illustrates the response of a minimal phase delay low-pass pre-filter 202 that has substantially no attenuation or phase delay up to a frequency Fcor and has substantial attenuation after frequency Fcor. As seen in graph 302 application of pre-filter 202 to reference error signal 120 results in filtered reference error signal 204 that has no attenuation up to frequency Fcor substantially maximal frequency attenuation after frequency Fcor. As seen in graph 302, the excitation response region of unfiltered signal 120 is significantly attenuated (e.g., up to about 10 db) in filtered signal 204 as a result of application of pre-filter 202.

It is to be appreciated that in an alternate embodiment pre-filter 202 may have different frequency response, amplitude response and/or phase response characteristics. For example, pre-filter 202 may be a low pass filter, a band pass filter, a band stop filter a high pass filter, a notch filter with application specific amplitude response and nonlinear phase characteristics. It is to be appreciated that the type of filter and non-linear phase characteristics can be application specific.

Figure 4:
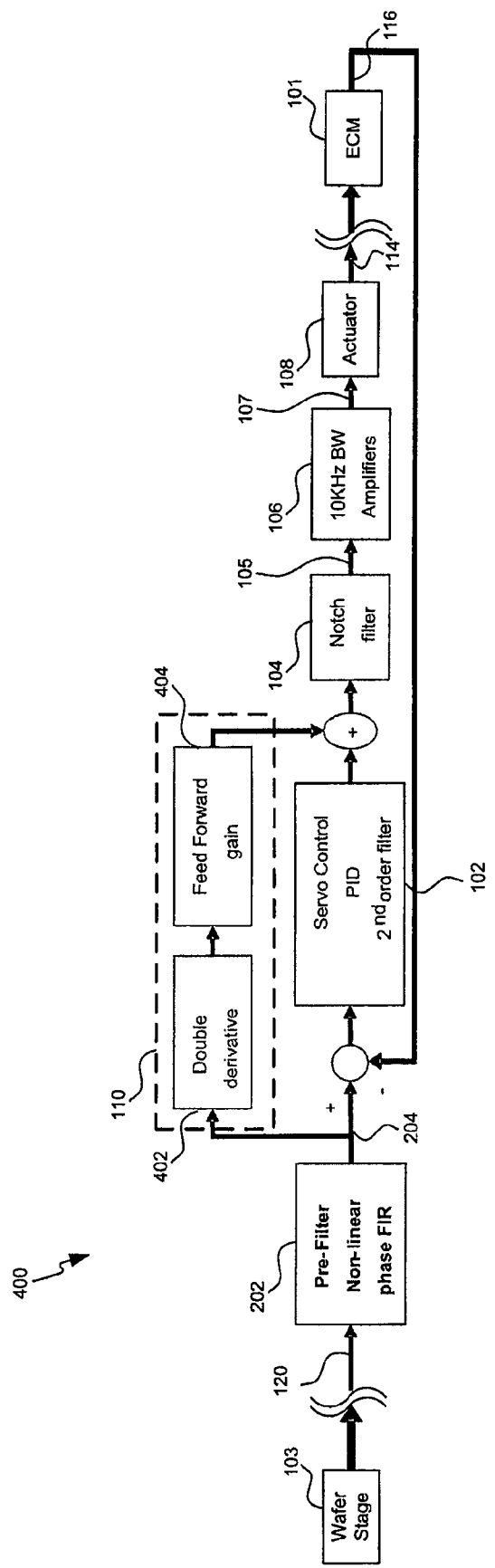
FIG. 4 illustrates an exemplary system to control position of an error mirror using a servo error control signal.

FIG. 4 illustrates an exemplary control system 400, for example used to control the position of error mirrors forming part of module 101 in a lithographic system. In the present embodiment, pre-filter 202 is a low pass nonlinear finite impulse response filter with substantially zero phase delay. First feed forward circuit 110 comprises a double derivative circuit 402 and a feed forward gain circuit 404. Servo controller 102 includes a Proportional Integral Derivative (PID) second order filter. Filter 104 is a notch filter, amplifier 106 is an about a 10 KHz bandwidth amplifier and module 101 is an error control mirror (ECM) and module 103 is a wafer stage WT of a lithographic system.

In the present example, reference error signal 120 indicates any error in a position of a wafer or substrate table (not shown, but see wafer or substrate table WT, e.g., FIG. 5). Error mirrors in module 101 are controlled by actuator 108 as a function of error signal 120 to compensate for errors in the position of wafer stage table WT 103 by redirecting beam B (shown in FIG. 5). Pre-filter 202 filters reference error signal 120 prior to the servo control loop of actuator 108. Thus, in this example, using pre-filter 202 provides a means to tune a response of actuator 108.

Phase contribution from pre-filter 202 may introduce a tracking error that is not correctable by the servo control loop. To prevent the tracking error, pre-filter 202 has substantially zero phase delay in the desired pass band region (for example, Fcor of about 900 Hz) with non-monotonic attenuation and non linear phase response.

In an embodiment, pre-filter 202 has about 301 taps and runs at about 20 KHz and servo controller 102 has about a 2 KHz bandwidth. Feed forward gain circuit 404, servo controller 102 and notch filter 104 run at a servo sample frequency baseline of about 100 KHz.

In operation, control system 400 sums a signal 116 fed back from ECM 101 and the post filtered signal 204 from Pre-Filter 202 before Servo Control PID 102. Signal 114 is based on a filtered and amplified signal 107 from amplifier 106, which signal is comprised of a summed signal from first feed forward circuit 110 and a signal from Servo Control PID 102 and filtered signal 105 from notch filter 104.

3. Example Lithographic Projection Apparatus

FIG. 5 depicts a lithographic apparatus according to an embodiment of the invention. The apparatus comprises an illumination system IL, a support structure MT, a substrate table WT, and a projection system PS.

The illumination system IL is configured to condition a radiation beam B (e.g., a beam of UV radiation as provided by a mercury arc lamp, or a beam of DUV radiation generated by a KrF excimer laser or an ArF excimer laser).

The illumination system may include various types of optical components, such as refractive, reflective, and diffractive types of optical components, or any combination thereof, for directing, shaping, or controlling radiation.

The support structure (e.g., a mask table) MT is constructed to support a patterning device (e.g., a mask or dynamic patterning device) MA having a mask pattern MP and connected to a first positioner PM configured to accurately position the patterning device in accordance with certain parameters. In an embodiment, position of first positioner PM is controlled by actuator 108 of system 200.

The substrate table (e.g., a wafer table) WT is constructed to hold a substrate (e.g., a resist-coated wafer) W and connected to a second positioner PW configured to accurately position the substrate in accordance with certain parameters. In an embodiment, position of second positioner PW is controlled by actuator 108 of system 200. In an alternate embodiment, actuator 108 of system 200 is used to control the position of an error control mirror 101 (not specifically shown in FIG. 5, but see FIG. 4) that redirects beam B to account for any deviations due to incorrect positioning of PW or PM.

The projection system (e.g., a refractive projection lens system) PS is configured to project a pattern imparted to the radiation beam B by the pattern MP of the patterning device MA onto a target portion C (e.g., comprising one or more dies) of the substrate W.

The support structure supports, i.e., bears the weight of, the patterning device. It holds the patterning device in a manner that depends on the orientation of the patterning device, the design of the lithographic apparatus, and other conditions, such as for example whether or not the patterning device is held in a vacuum environment. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that may be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern MP includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which may be individually tilted so as to reflect an incoming radiation beam in different directions. The tilted mirrors impart a pattern in a radiation beam which is reflected by the mirror matrix. In an embodiment, actuator 108 of system 200 is used to correct the position of tilted mirrors of the patterning device.

The term "projection system" used herein should be broadly interpreted as encompassing any type of projection system, including refractive, reflective, and catadioptric optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 5, the illumination system IL receives a radiation beam from a radiation source SO. The source and the lithographic apparatus may be separate entities, for example when the source is an excimer laser. In such cases, the radiation beam is passed from the source SO to the illumination system IL with the aid of a beam delivery system BD comprising, for example, suitable directing mirrors and/or a beam expander. In other cases the source may be an integral part of the lithographic apparatus, for example when the source is a mercury lamp. The source SO and the illumination system IL, together with the beam delivery system BD if required, may be referred to as a radiation system.

The illumination system IL may comprise an adjuster AD for adjusting the angular intensity distribution of the radiation beam at mask level. Generally, at least the outer and/or inner radial extent (commonly referred to as σ-outer and σ-inner, respectively) of the intensity distribution in a pupil IPU of the illumination system may be adjusted. In addition, the illumination system IL may comprise various other components, such as an integrator IN and a condenser CO. The illumination system may be used to condition the radiation beam, to have a desired uniformity and intensity distribution in its cross-section at mask level.

The radiation beam B is incident on the patterning device (e.g., mask MA or programmable patterning device), which is held on the support structure (e.g., mask table MT), and is patterned by the patterning device in accordance with a pattern MP. Having traversed the mask MA, the radiation beam B passes through the projection system PS, which focuses the beam onto a target portion C of the substrate W.

The projection system has a pupil PPU conjugate to the illumination system pupil IPU, where portions of radiation emanating from the intensity distribution at the illumination system pupil IPU and traversing a mask pattern without being affected by diffraction at a mask pattern create an image of the intensity distribution at the illumination system pupil IPU.

With the aid of the second positioner PW and position sensor IF (e.g., an interferometric device, linear encoder or capacitive sensor), the substrate table WT may be moved accurately, e.g., so as to position different target portions C in the path of the radiation beam B. Similarly, the first positioner PM and another position sensor (which is not explicitly depicted in FIG. 5) may be used to accurately position the mask MA with respect to the path of the radiation beam B, e.g., after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C may be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e., a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation may be readily applied to maskless lithography that utilizes a programmable patterning device, such as a programmable mirror array of a type as referred to above.

Combinations and/or variations on the above described modes of use or entirely different modes of use may also be employed.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm).

In accordance with an embodiment of the invention, communication of information between the various components of the present invention is accomplished over a network consisting of electronic devices connected either physically or wirelessly, wherein digital information is transmitted from one device to another. Such devices may include, but are not limited to, a desktop computer, a laptop computer, a handheld device or PDA, a telephone, a set top box, an Internet appliance, or the like. Exemplary networks include a Local Area Network, a Wide Area Network, an organizational intranet, the Internet, or the like. The functionality of an exemplary computer and network are further explained in conjunction with FIG. 6, below.

4. Example Computer System

The present invention may be implemented using hardware, software or a combination thereof and may be implemented in one or more computer systems or other processing systems. However, the manipulations performed by the present invention were often referred to in terms, such as adding or comparing, which are commonly associated with mental operations performed by a human operator. No such capability of a human operator is necessary, or desirable in most cases, in any of the operations described herein which form part of the present invention. Rather, the operations are machine operations. Useful machines for performing the operation of the present invention include general purpose digital computers or similar devices.

Figure 6:
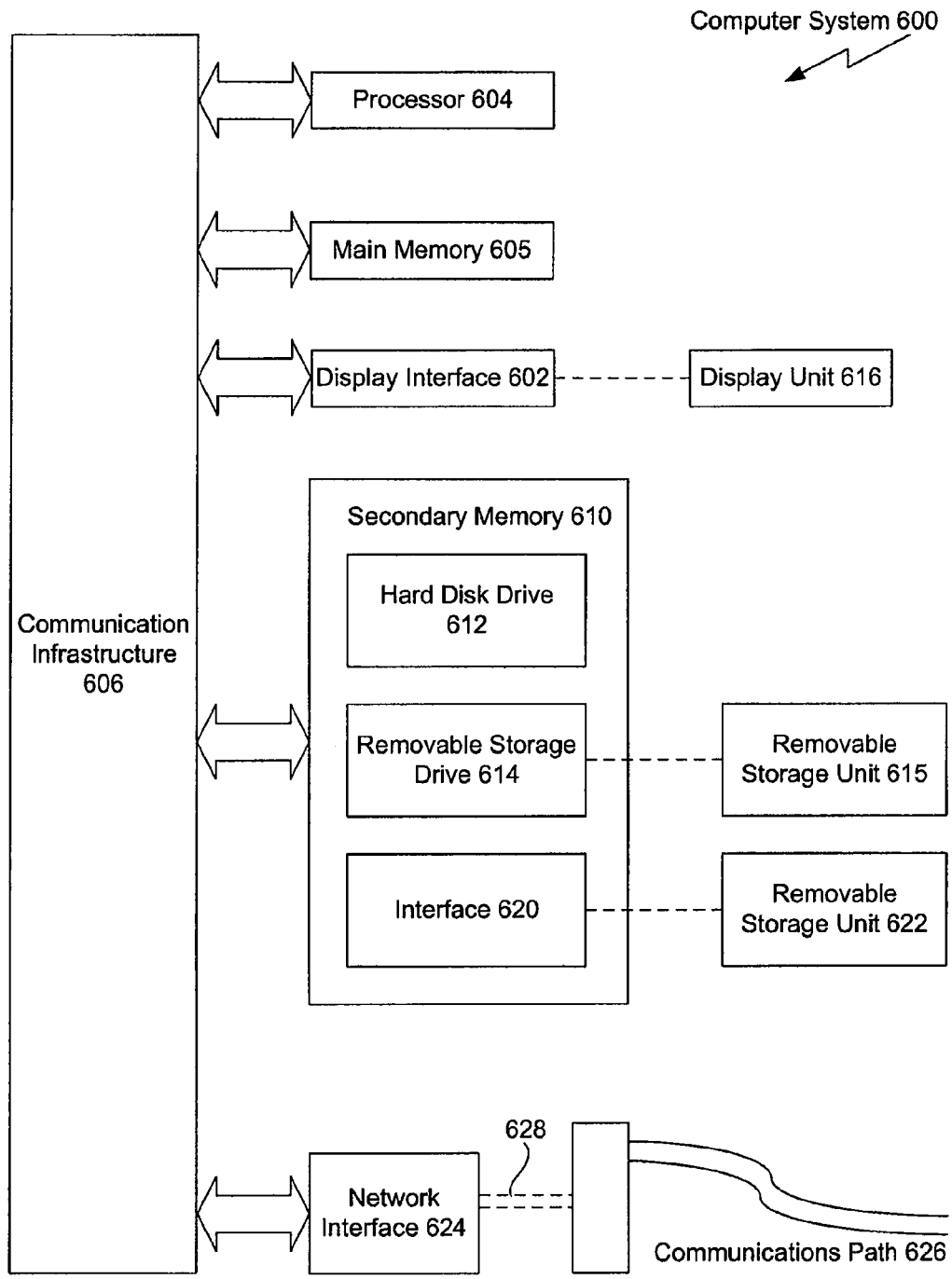
FIG. 6 is a block diagram of a computer system.

In fact, in one embodiment, the invention is directed toward one or more computer systems capable of carrying out the functionality described herein. An example of a computer system 600 is shown in FIG. 6.

Computer system 600 includes one or more processors, such as processor 604. Processor 604 is connected to a communication infrastructure 606 (e.g., a communications bus, cross over bar, or network). Various software embodiments are described in terms of this exemplary computer system. After reading this description, it will become apparent to a person skilled in the relevant art(s) how to implement the invention using other computer systems and/or architectures.

Computer system 600 can include a display interface 602 that forwards graphics, text, and other data from communication infrastructure 606 (or from a frame buffer not shown) for display on display unit 616.

Computer system 600 also includes a main memory 605, preferably random access memory (RAM), and may also include a secondary memory 610. Secondary memory 610 may include, for example, a hard disk drive 612 and/or a removable storage drive 614, representing a floppy disk drive, a magnetic tape drive, an optical disk drive, etc. Removable storage drive 614 reads from and/or writes to a removable storage unit 615 in a well known manner. Removable storage unit 615 represents a floppy disk, magnetic tape, optical disk, etc. which is read by and written to by removable storage drive 614. As will be appreciated, removable storage unit 615 includes a computer usable storage medium having stored therein computer software and/or data.

In alternative embodiments, secondary memory 610 may include other similar devices for allowing computer programs or other instructions to be loaded into computer system 600. Such devices may include, for example, a removable storage unit 615 and an interface 620. Examples of such may include a program cartridge and cartridge interface (such as that found in video game devices), a removable memory chip (such as an erasable programmable read only memory (EPROM), or programmable read only memory (PROM)) and associated socket, and other removable storage units 615 and interfaces 620, which allow software and data to be transferred from removable storage unit 615 to computer system 600.

Computer system 600 may also include a communications interface 624. Communications interface 624 allows software and data to be transferred between computer system 600 and external devices. Examples of communications interface 624 may include a modem, a network interface (such as an Ethernet card), a communications port, a Personal Computer Memory Card International Association (PCMCIA) slot and card, etc. Software and data transferred via communications interface 624 are in the form of signals 628 which may be electronic, electromagnetic, optical or other signals capable of being received by communications interface 624. These signals 628 are provided to communications interface 624 via a communications path (e.g., channel) 626. This channel 626 carries signals 628 and may be implemented using wire or cable, fiber optics, a telephone line, a cellular link, an radio frequency (RF) link and other communications channels.

In this document, the terms "computer program medium" and "computer usable medium" are used to generally refer to media such as removable storage drive 614, a hard disk installed in hard disk drive 612, and signals 628. These computer program products provide software to computer system 600. The invention is directed to such computer program products.

Computer programs (also referred to as computer control logic) are stored in main memory 605 and/or secondary memory 610. Computer programs may also be received via communications interface 624. Such computer programs, when executed, enable computer system 600 to perform the features of the present invention, as discussed herein. In particular, the computer programs, when executed, enable processor 604 to perform the features of the present invention. Accordingly, such computer programs represent controllers of computer system 600.

In an embodiment where the invention is implemented using software, the software may be stored in a computer program product and loaded into computer system 600 using removable storage drive 614, hard drive 612 or communications interface 624. The control logic (software), when executed by processor 604, causes processor 604 to perform the functions of the invention as described herein.

In another embodiment, the invention is implemented primarily in hardware using, for example, hardware components such as application specific integrated circuits (ASICs). Implementation of the hardware state machine so as to perform the functions described herein will be apparent to persons skilled in the relevant art(s).

In yet another embodiment, the invention is implemented using a combination of both hardware and software.

Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

5. Exemplary Operation

Figure 7:
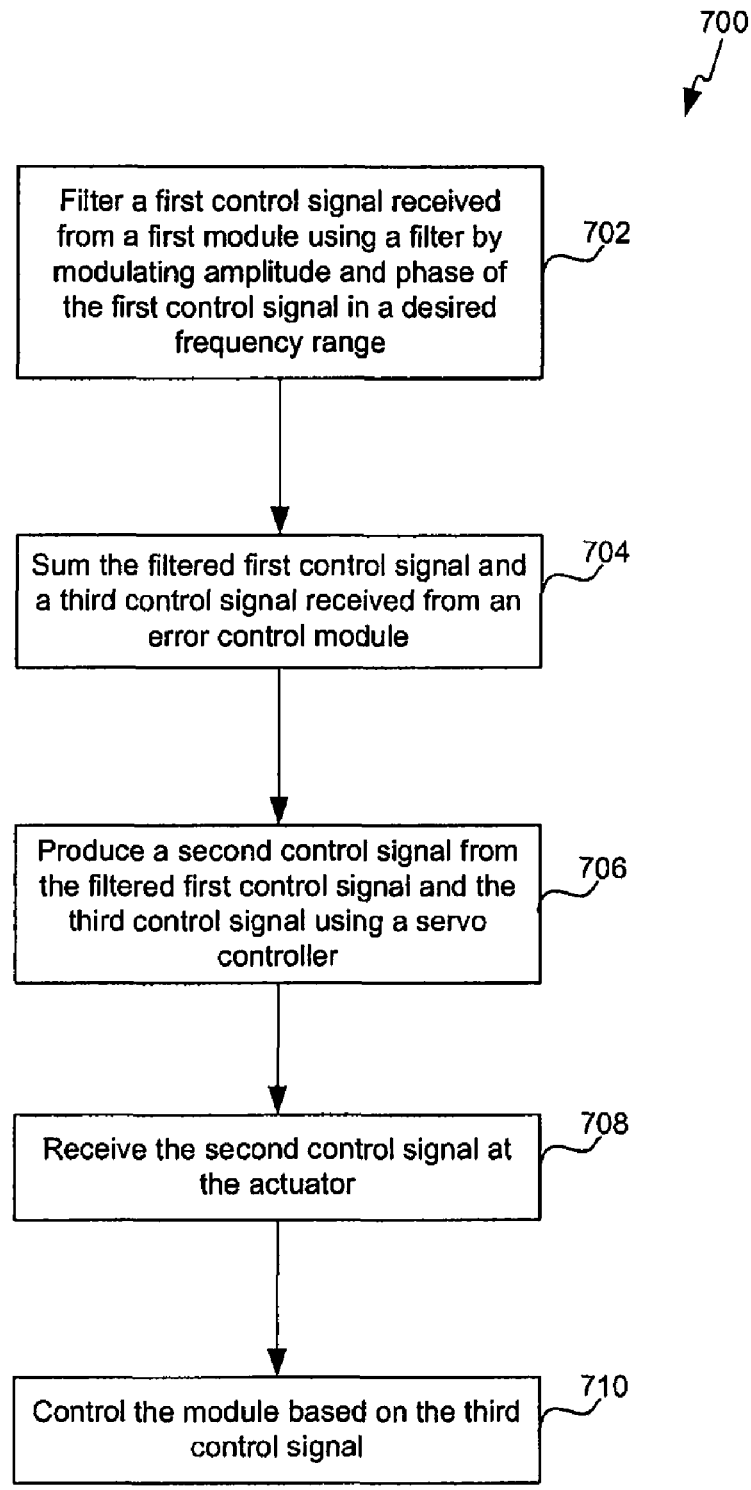
FIG. 7 is a flow chart depicting an exemplary method.

FIG. 7 is a flow chart depicting an exemplary method 700. In block 702, a first control signal received from a first module is filtered using a filter by modulating amplitude and phase of the first control signal in a desired frequency range. In block 704, the filtered first control signal and a third control signal received from an error control module are summed. In block 706, a second control signal is produced from the filtered first control signal and the third control signal using a servo controller. In block 708, the second control signal is received at the actuator. In block 710, the error control module, used to correct error in position, velocity or acceleration of the first module, is controlled using the third control signal.

6. CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections can set forth one or more, but not all exemplary embodiments of the present invention as contemplated by the inventor(s), and thus, are not intended to limit the present invention and the appended claims in any way.

What is claimed is:

1. A servo control loop, comprising:
a first filter configured to filter a first control signal received from a first module by modulating an amplitude and phase of the first control signal in a desired frequency range and outputting a filtered first control signal;
a servo controller configured to:
receive the filtered first control signal and a third control signal; and
provide a second control signal therefrom;
a summing device configured to sum the second control signal and outputs of first feed forward circuit and a second feed forward circuit;
a second filter configured to receive the summed outputs of the second control signal, the first feed forward and the second feed forward circuit and provide an output signal;
an actuator coupled between the second filter and a second module is configured to:
receive the output of the second filter; and
provide the third control signal therefrom, wherein the third control signal is received at the second module and is configured to control the first module.

2. The servo control loop of claim 1, wherein the first control signal is a servo error control signal.

3. The servo control loop of claim 1, wherein the first filter has a non-linear phase characteristic.

4. The servo control loop of claim 3, wherein the non-linear phase characteristic is a substantially zero phase delay in a desired frequency range of the first control signal.

5. The servo control loop of claim 1, further comprising an amplifier coupled to the actuator and the second filter that is coupled between the servo controller and the amplifier.

6. The servo control loop of claim 1, wherein the first control signal is modulated by amplifying a desired frequency range of the first control signal, attenuating the remaining frequency range of the first control signal, and maintaining a substantially zero phase delay.

7. The servo control loop of claim 1, wherein a module is located within a lithography apparatus.

8. The servo control loop of claim 1, wherein the desired frequency range is one of a lower range of frequency, a higher range of frequency, or an intermediate range of frequency.

9. The servo control loop of claim 1, wherein the first filter is one of a low-pass, a high pass, a band-stop, and a band-pass filter having non-linear phase characteristics.

10. The servo control loop of claim 1, wherein the actuator comprises an error control motor configured to control the second module.

11. The servo control loop of claim 1, wherein the second module comprises a mirror that directs a beam of light to a substrate table of a lithography apparatus.

12. The servo control loop of claim 1, wherein the first feed forward circuit comprises a double derivative circuit and a feed forward gain circuit.

13. The servo control loop of claim 1, wherein the second filter is a notch filter.

14. The servo control loop of claim 1, wherein the servo controller includes a Proportional Integral Derivative (PID) second order filter.

15. The servo control loop of claim 1, wherein the second module is an optical system in a lithography apparatus.

16. A method, comprising:
filtering a first control signal received from a first module using a first filter by modulating amplitude and phase of the first control signal in a desired frequency range;
summing the filtered first control signal and a third control signal received from an actuator;
producing a second control signal from the filtered first control signal and the third control signal using a servo controller;
summing:
an output of a first feed forward circuit;
an output of a second feed forward circuit; and
the second control signal;
receiving the summed outputs of the first feed forward circuit, the second feed forward circuit, and the second control signal at a second filter;
receiving an output of the second filter at the actuator; and
controlling an error control module using the third control signal.

17. A computer program product comprising a non-transitory computer useable medium including control logic stored therein for controlling the position of a module in a lithography apparatus, comprising:
first control logic means for causing a computer to filter, by a first filter, a first control signal received from a first module by modulating amplitude and phase of the first control signal in a desired frequency range;
second control logic means for causing a computer to sum the filtered first control signal and a third control signal received from an actuator;
third control logic means for causing a computer to provide a second control signal from the filtered first control signal and the third control signal;
fourth control logic means for causing a computer to sum an output of a first feed forward circuit, an output of a second feed forward circuit, and the second control signal;
fifth control logic means for causing a computer to receive the summed outputs of the first feed forward circuit, the second feed forward circuit, and the second control signal at a second filter;
sixth control logic means for causing a computer to receive an output of the second filter at the actuator; and
seventh control logic means for causing a computer to control an error control module using the third control signal.

18. A non-transitory computer-readable medium containing instructions for controlling at least one processor of a host computer by a method comprising:
filtering a first control signal received from a first module using a first filter by modulating amplitude and phase of the first control signal in a desired frequency range;
summing the filtered first control signal and a third control signal received from an actuator;
producing a second control signal from the filtered first control signal and the third control signal using a servo controller;
summing:
an output of a first feed forward circuit;
an output of a second feed forward circuit; and
the second control signal;
receiving the summed outputs of the first feed forward circuit, the second feed forward circuit, and the second control signal at a second filter;
receiving an output of the second filter at the actuator; and
controlling an error control module using the third control signal.

* * * * *